(12) United States Patent
Wang et al.

(10) Patent No.: US 10,964,386 B2
(45) Date of Patent: Mar. 30, 2021

(54) INITIALISATION OF A STORAGE DEVICE

(71) Applicant: Arm Limited, Cambridge (GB)

(72) Inventors: Wei Wang, Cambridge (GB); Shidhartha Das, Upper Cambourne (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/496,820

(22) PCT Filed: Mar. 26, 2018

(86) PCT No.: PCT/GB2018/050782
§ 371 (c)(1),
(2) Date: Sep. 23, 2019

(87) PCT Pub. No.: WO2018/178644
PCT Pub. Date: Oct. 4, 2018

(65) Prior Publication Data
US 2020/0286557 A1 Sep. 10, 2020

(30) Foreign Application Priority Data
Mar. 31, 2017 (GB) .................................. 1705294.5

(51) Int. Cl.
*G11C 7/20* (2006.01)
*G11C 13/00* (2006.01)
(52) U.S. Cl.
CPC ...... *G11C 13/0069* (2013.01); *G11C 13/0007* (2013.01); *G11C 13/0023* (2013.01); *G11C 13/0061* (2013.01); *G11C 2213/32* (2013.01)

(58) Field of Classification Search
CPC ... G11C 7/20; G11C 13/0002; G11C 13/0007; G11C 13/0023; G11C 13/0061; G11C 13/0069; G11C 2213/32; G11C 7/24
See application file for complete search history.

(56) References Cited

U.S. PATENT DOCUMENTS

| 4,984,215 A | 1/1991 | Ushida |
| 5,325,325 A | 6/1994 | Azuma |
| 7,200,743 B1 | 4/2007 | Malpass |
| 9,514,814 B1 | 12/2016 | Sandhu et al. |
| 9,558,819 B1 | 1/2017 | Aitken et al. |

(Continued)

FOREIGN PATENT DOCUMENTS

| JP | S61105793 | 5/1986 |
| JP | H0476643 A | 3/1992 |
| WO | 2017025761 A1 | 2/2017 |

OTHER PUBLICATIONS

European Patent Office, ISR/WO, PCT/GB2018/050782, dated Aug. 22, 2018.

*Primary Examiner* — Thong Q Le
(74) *Attorney, Agent, or Firm* — Leveque IP Law, P.C.

(57) ABSTRACT

There is provided a system comprising: a storage device having a storage portion comprising a plurality of bitcells coupled to respective first signal lines and second signal lines and control logic to alter a memory state of the plurality of bitcells via the first signal lines and second signal lines; a memory controller coupled to the storage device to transmit one or more initialisation signals to the storage device; wherein the storage device is to initialise the storage portion over a clock cycle in response to the one or more initialisation signals.

20 Claims, 10 Drawing Sheets

(56) References Cited

U.S. PATENT DOCUMENTS

| | | |
|---|---|---|
| 2001/0046173 A1 | 11/2001 | Yoshikoshi |
| 2008/0094877 A1 | 4/2008 | Schneider |
| 2011/0032784 A1 | 2/2011 | Pyeon |
| 2013/0141221 A1* | 6/2013 | Oksanen .............. H04R 25/407 340/10.5 |

\* cited by examiner

INITIALISATION OF A STORAGE DEVICE

CROSS-REFERENCE TO RELATED APPLICATIONS

This application is the National Stage of International Application No. PCT/GB2018/050782, filed on Mar. 26, 2018, which claims priority to foreign patent application no. GB 1705294.5, filed on Mar. 31, 2017, the contents of which are incorporated herein by reference in their entireties.

BACKGROUND

The present disclosure relates to techniques for accessing memory in computing systems, and particularly, but not exclusively, to techniques for initialising bits in memory.

In a computing system, different applications (or processes) may use the same memory, whereby it is possible for a subsequent application to access or recover data from memory that was used by a previous application, and whereby the recovered data may include sensitive/security information. Such access may occur, for example, in systems with persistent memory after rebooting from power failures.

To prevent such access, the memory, or a portion thereof, may be initialised before access by an application, or to increase the efficiency of an application (e.g. a cryptographic operation).

Such initialisation may include Kernel zeroing for initialization so data will not be leaked to another process.

Furthermore, Linux performs lazy initialising when the pages are being written to, i.e. "Copy-on-Write", whilst FreeBSD does eager initialisation, by initialising a plurality of pages of memory over multiple clock cycles and maintaining a memory pool for allocation. Userspace applications are required to initialise heap memory pages after allocation by memset as in C, or initialised implicitly by constructors as in C++ or C#.

Furthermore still, hypervisors initialise physical pages over multiple clock cycles before allocating those pages to another machine, e.g. for inter-virtual machine security/data privacy.

However, initialisation is becoming an increasingly time- & power-consuming process as memory capacity and application demand grows. Thus, there is a need for improved methods for implementing initialisation.

BRIEF DESCRIPTION OF THE DRAWINGS

The techniques are diagrammatically illustrated, by way of example, in the accompanying drawings, in which:

FIG. 3b schematically shows a timing diagram for initialising a portion of the memory of FIG. 3a;

FIG. 4b schematically shows a timing diagram for initialising a portion of the memory of FIG. 4a;

Like numbering used will be used to describe like features throughout the specification.

DETAILED DESCRIPTION

According to a first technique, there is provided a system comprising: a storage device having a storage portion comprising a plurality of bitcells coupled to respective first signal lines and second signal lines and control logic to alter a memory state of the plurality of bitcells via the first and second signal lines; a memory controller coupled to the storage device to transmit one or more initialisation signals to the storage device; wherein the storage device is to initialise the storage portion over a clock cycle in response to the one or more initialisation signals.

According to a further technique, there is provided a method of initialising a portion of storage on a storage device, the method comprising: generating, at a memory controller, initialisation signals based, at least in part, on instructions from a bus master to initialise the portion of storage, the portion of storage comprising a plurality of bitcells coupled to respective first signal lines and second signal lines; decoding, at the storage device, the initialisation signals; initialising, at the storage device, the storage portion over a clock cycle.

According to a further technique, there is provided a non-transitory data carrier carrying code which, when implemented on a processor, causes the processor to carry out the method.

According to a further technique, there is provided a memory controller comprising: one or more buffers to receive access requests from a bus master; an arbiter to determine the order in which the access requests are executed; a signal interface to generate hardware signals based, at least in part, on the access requests; and wherein the hardware signals include one or more of: an initialise signal, an initialise address signal, an initialise range signal, and an initialise data signal.

According to a further technique, there is provided a storage device, having an addressable portion comprising a plurality of bitcells coupled to respective first signal lines and second signal lines, and control logic to alter a memory state of the bitcells; wherein the storage device is to initialise the plurality of bitcells over a clock cycle.

Figure 1:
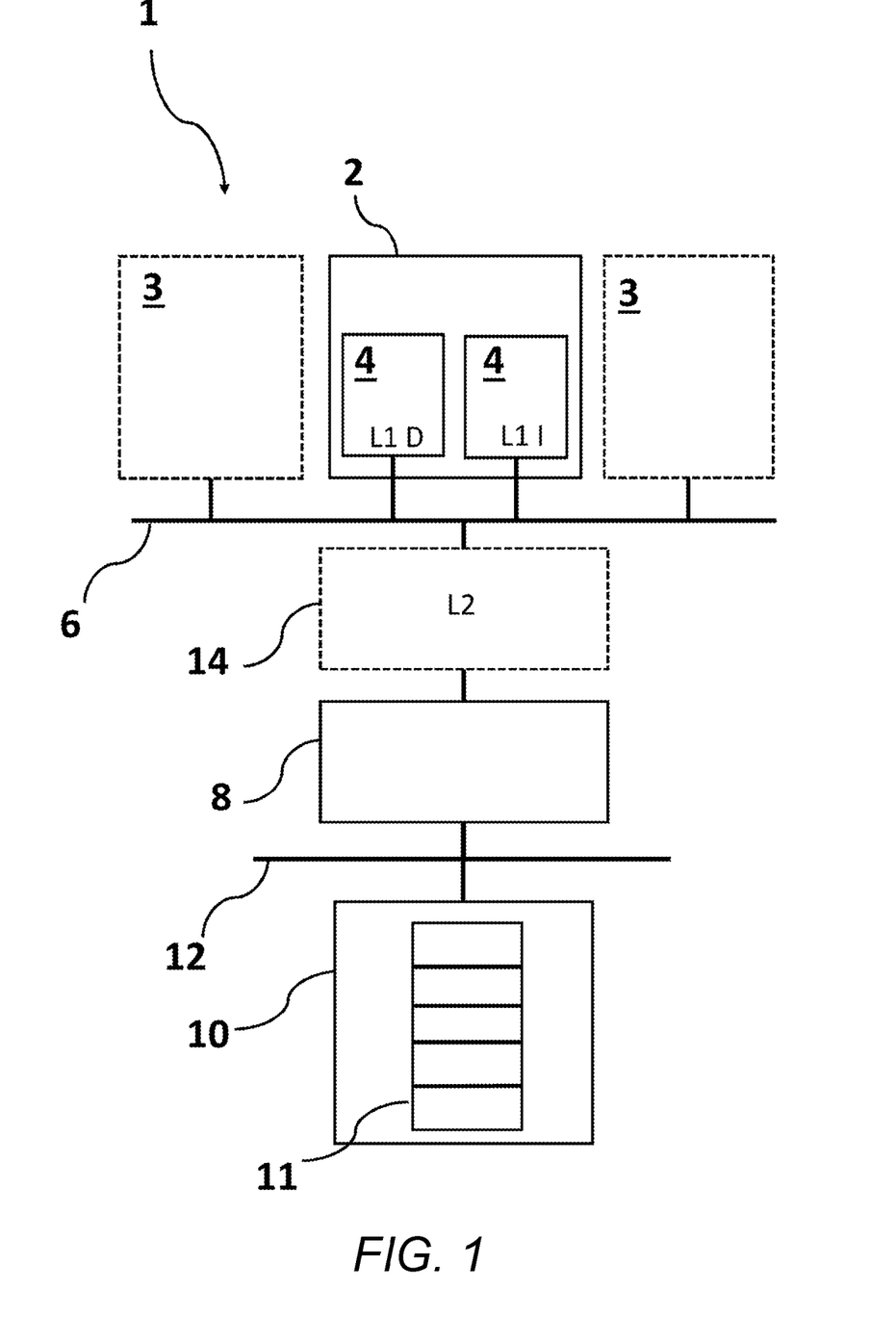
FIG. 1 schematically shows a block diagram of a computing system in accordance with an embodiment.

FIG. 1 schematically shows a block diagram of a computing system 1, comprising a bus master 2, which in the present example comprises a processor 2.

The processor may include a general purpose processor, a network processor, an application processor (e.g. as used in mobile telephones), or other types of processor (including a reduced instruction set computer (RISC) processor or a complex instruction set computer (CISC) processor). Furthermore, the processor 2 may have a single or multiple core.

In the present example, the processor 2 comprises local memory 4, depicted as a level 1 (L1) cache 4 for caching data (L1 D) and instructions (L1 I) local to the processor 2.

An interconnection or bus 6, hereafter "system bus" 6 couples the processor 2 to a memory controller 8, which is coupled to a storage device 10, which in the illustrative examples comprises memory 10, via interconnection or bus 12, hereafter "memory bus" 12.

Memory controller 8 receives read or write requests generated by the processor 2, and generates signals to access memory 10 in response to the read or write requests as described below.

The memory 10 comprises control logic to decode the signals received from the memory controller and provide the read or write access accordingly.

In embodiments, the memory 10 comprises a plurality of addressable bitcells 11. It will be appreciated that a "bitcell" as referred to herein comprises a circuit or portion of a circuit capable of storing a value, symbol, parameter or condition to represent a memory state thereof.

Memory 10 may be non-volatile memory such as nanowire memory, ferro-electric transistor random access memory (FeTRAM), magnetoresistive random access memory (MRAM), flash memory, Spin Torque Transfer Random Access Memory (STTRAM), STT magnetic RAM (STTM-RAM), 3D cross point memory such as phase change memory (PCM), an SSD with NAND/NOR memory, memory utilising correlated electron material (CEM) etc. In some embodiments, the NVM memory 10 may comprise a storage class memory (SCM).

In other embodiments memory 10 may be a volatile memory, such as a random-access memory (RAM) (e.g. static RAM (SRAM) or dynamic RAM (DRAM)).

Although not specifically depicted, further logic may be provided in the system 1.

For example, as depicted in FIG. 1, a shared level 2 (L2) cache 14 may be provided between the system bus 6 and the memory controller 10, whereby the L2 cache 14 may be used to store data and/or instructions utilized by the processor 2.

As a further example, the system 1 may comprise further storage (not shown), such as a hard-disk drive (HDD), or may comprise additional or alternative bus masters (depicted as bus master(s) 3) which may include one or more of: processor(s), graphics processing unit(s) (GPU), direct memory access (DMA) controller(s) and input/output (I/O) interface(s), although this list is not exhaustive.

Figure 2:
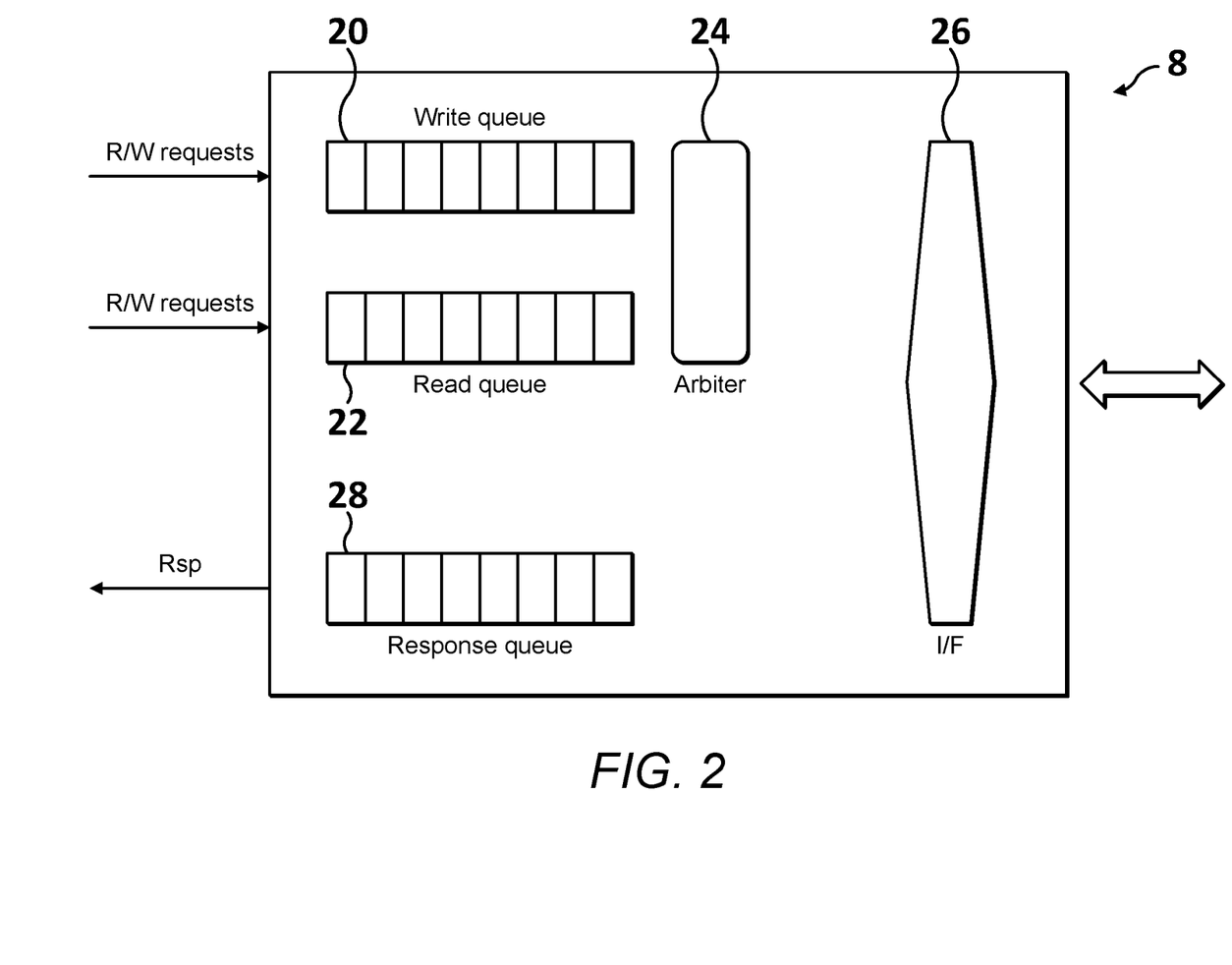
FIG. 2 schematically shows a block diagram of a memory controller in accordance with an embodiment.

FIG. 2 schematically shows a block diagram of a memory controller 8 in accordance with an embodiment, whereby the memory controller 8 comprises buffers or queues to store the access requests, whereby the access requests may include read/write (e.g. initialisation) requests for a portion of memory, from the processor.

In the context of the present disclosure, initialisation of a target portion of memory generally refers to the process of writing the same value, symbol, parameter or condition to all the bitcells of the target portion such that all bitcells represent the same memory state.

In FIG. 2, the queues are illustratively depicted as a write queue 20 and read queue 22. The queues may operate as first-in-first-out (FIFO) queues.

An arbitration mechanism, depicted as arbiter 24, determines the order in which the access requests are executed, and the arbiter 24 may perform arbitration based on one or more of the efficiency, predictability, speed, and flexibility requirements of the system, although it will be appreciated that this list is not exhaustive and arbitration may be performed based other system requirements or user instructions.

Interface (I/F) 26 generates hardware/electrical signals in response to the executed read and write requests. The signals generated by the memory controller 8 may include, Address signal (A) and data signal (DQ), clock signal (CLK), write enable (WE) signal, read/write (R/W) signal to access the memory as will be understood by a skilled person.

In embodiments using the present techniques, the signal interface 26 also generates further signals to initialise a portion of the memory as will be described in greater detail below.

The interface (I/F) 26 may also receive signals (e.g. output signal (RQ) from memory depicted in FIGS. 3a, 4a & 4c-d), and generates a response signal (Rsp) to be transmitted to a bus master. In the present illustrative example, the memory controller 8 includes a response queue 28 for storing the received signals, whereby the response queue 28 may operate as a FIFO.

Figure 3A:
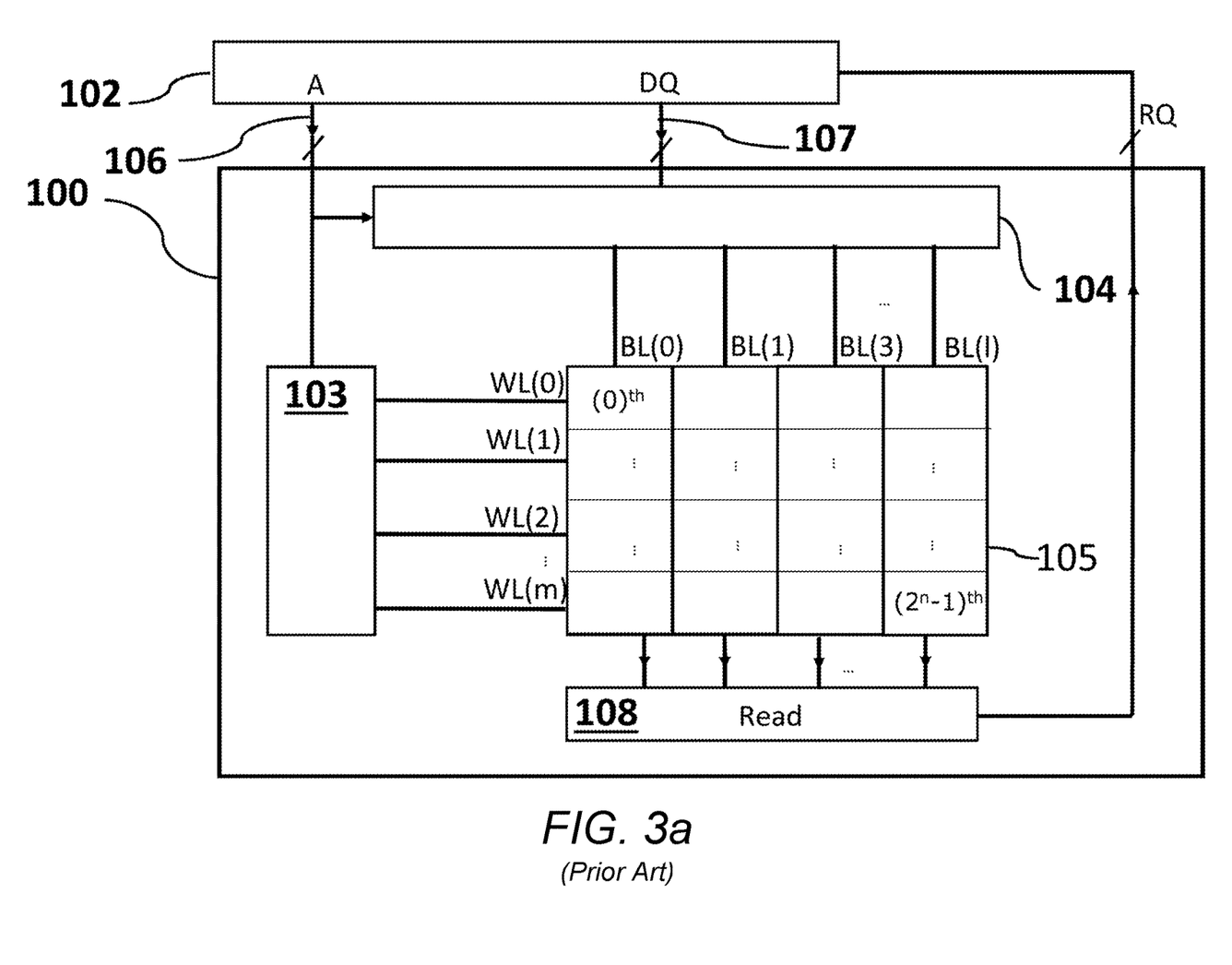
FIG. 3a schematically shows a block diagram of a memory and memory controller according to a prior art arrangement.
Figure 3B:
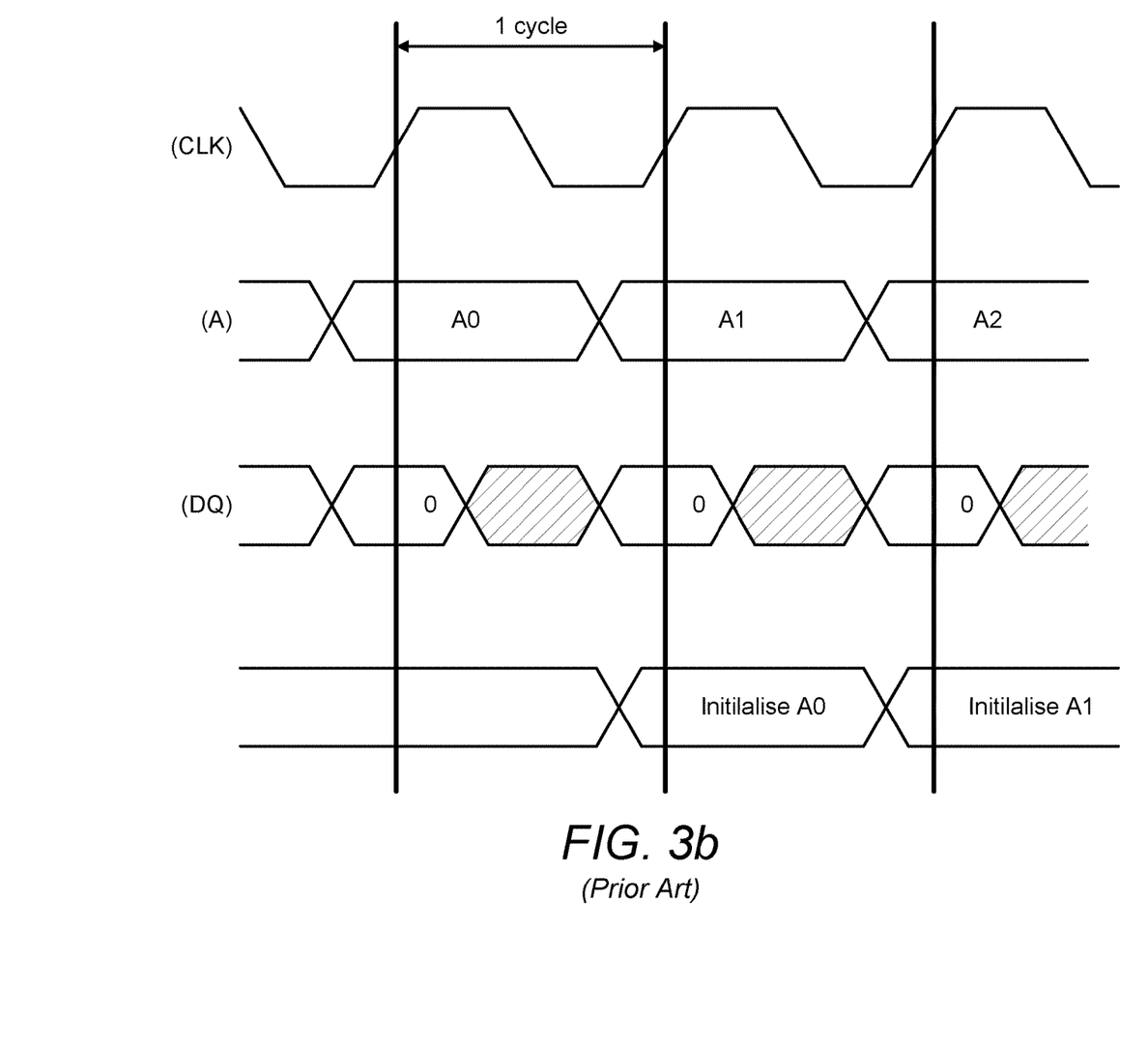

FIG. 3a schematically shows a block diagram of a memory 100 and memory controller 102 according to a prior art arrangement, whilst FIG. 3b schematically shows a timing diagram for initialising a portion of memory 100.

In the prior art arrangement, the memory 100 comprises control logic 103, 104 to decode one or more of the signals received from the memory controller 102.

The memory 100 further comprises a plurality of bitcells, which in the present illustrative example are arranged in a bank or array 105 comprising 'm' rows and 'l' columns, whereby each bitcell has a unique address defined by the intersection of a row and column, whereby the rows of bitcells are coupled to and addressable via respective signal lines arranged as wordlines WL(0) to WL(m), whilst the column of bitcells are coupled to and addressable via respective signal lines arranged as bitlines BL(0) to BL(1).

The memory 100 further comprises read logic 108 to determine the memory state of the bitcell(s), and generate an output (RQ) accordingly.

In the present arrangement, to initialise bitcells of a wordline of memory, and as depicted in FIG. 3b, the memory controller 102 generates an address signal (A0) to identify a first target bitcell or word to be initialised, whereby the address signal is provided on the address bus 106 in a first clock cycle, whereby the target bitcell may be the first bitcell of a word on a first wordline.

The memory controller 102 also provides the data signal (DQ) on the data bus 107, whereby the data signal (DQ) defines the memory state to be stored or written to the first target bitcell.

As depicted in FIG. 3b, on decoding the address and data signal, the control logic 103, 104 drives the respective wordline and bitline and to store the decoded memory state of (DQ) in the first target bitcell or bitcells of the word during a first clock cycle.

The memory controller 102 repeats the operation for each of the remaining addresses in the portion of memory to be initialised, with an address (A1, A2 etc.) being sent from the memory controller 102 to the control logic 103, 104 in consecutive clock cycles as depicted in FIG. 3b.

It will be appreciated, therefore, that initialising different bitcells or words comprises a serial operation performed over multiple clock cycles, with data being stored in one bitcell or word per clock cycle.

With that in mind, initialising a portion of memory (e.g. a 32 kb of memory) over multiple clock cycles would result in an application stalling until the initialisation of that portion of memory is complete, which may result in processing delays in the system 1.

Furthermore, writing a memory state to a bitcell will incur a write current. Taking STT-MRAM as an illustrative example, writing a memory to a bitcell of STT-MRAM draws approximately 1 mA, whereby the current drawn will increase dependent on the number of bitcells being written to over the same clock cycle.

As an illustrative example, writing a memory state to multiple bitcells comprising 32 kb of STT-MRAM memory during a single clock cycle will draw approximately 32 A.

Writing to a similar size portion (e.g. 32 kb) of other types of NV memory such as Flash memory or PCM over the same clock cycle may draw currents of similar magnitude, such that the number of bitcells written to over any one clock cycle is controlled to be one word or less depending on the application.

Figure 4A:
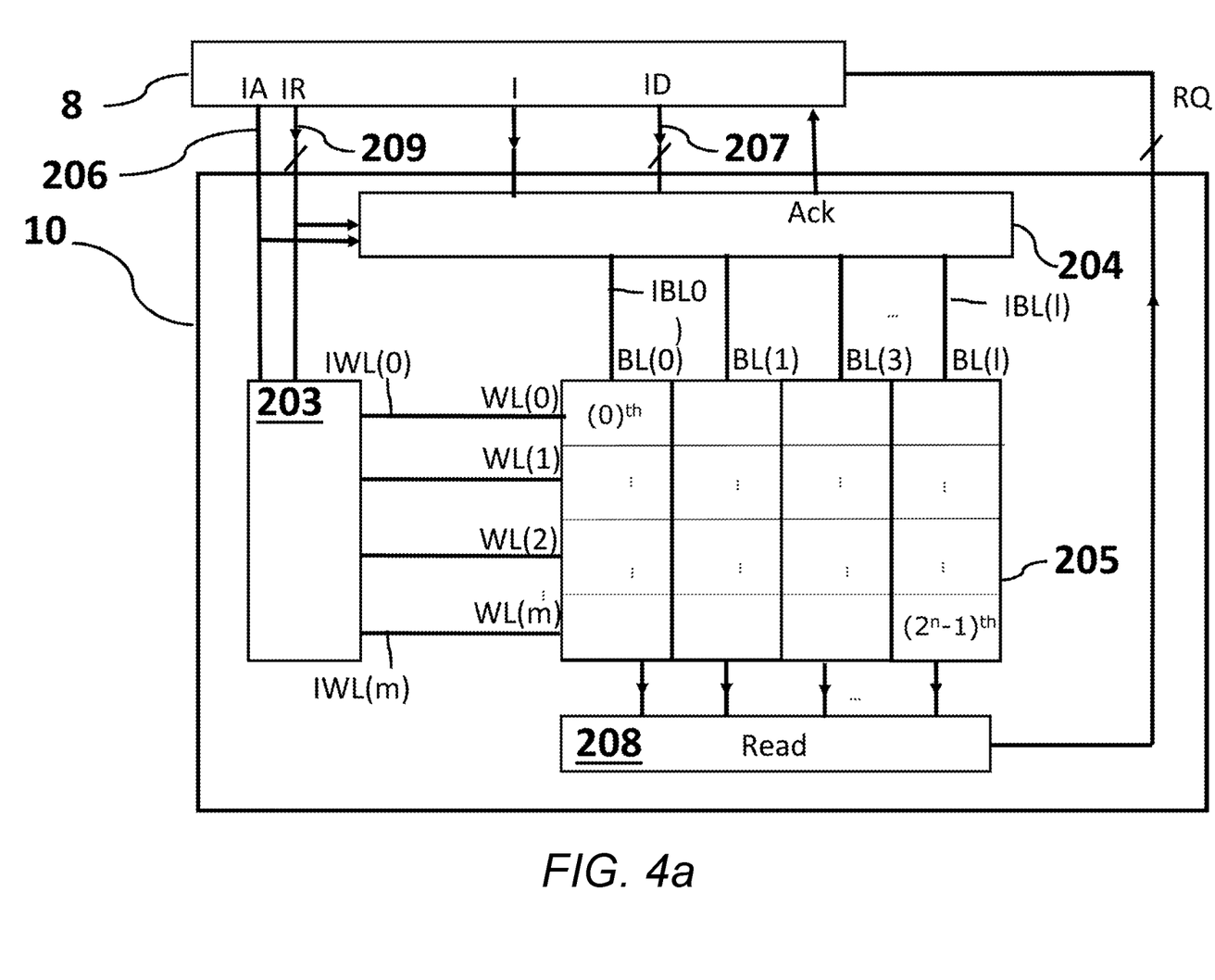
FIG. 4a schematically shows a diagram of a memory controller and a memory according to embodiments using the present techniques.
Figure 4B:
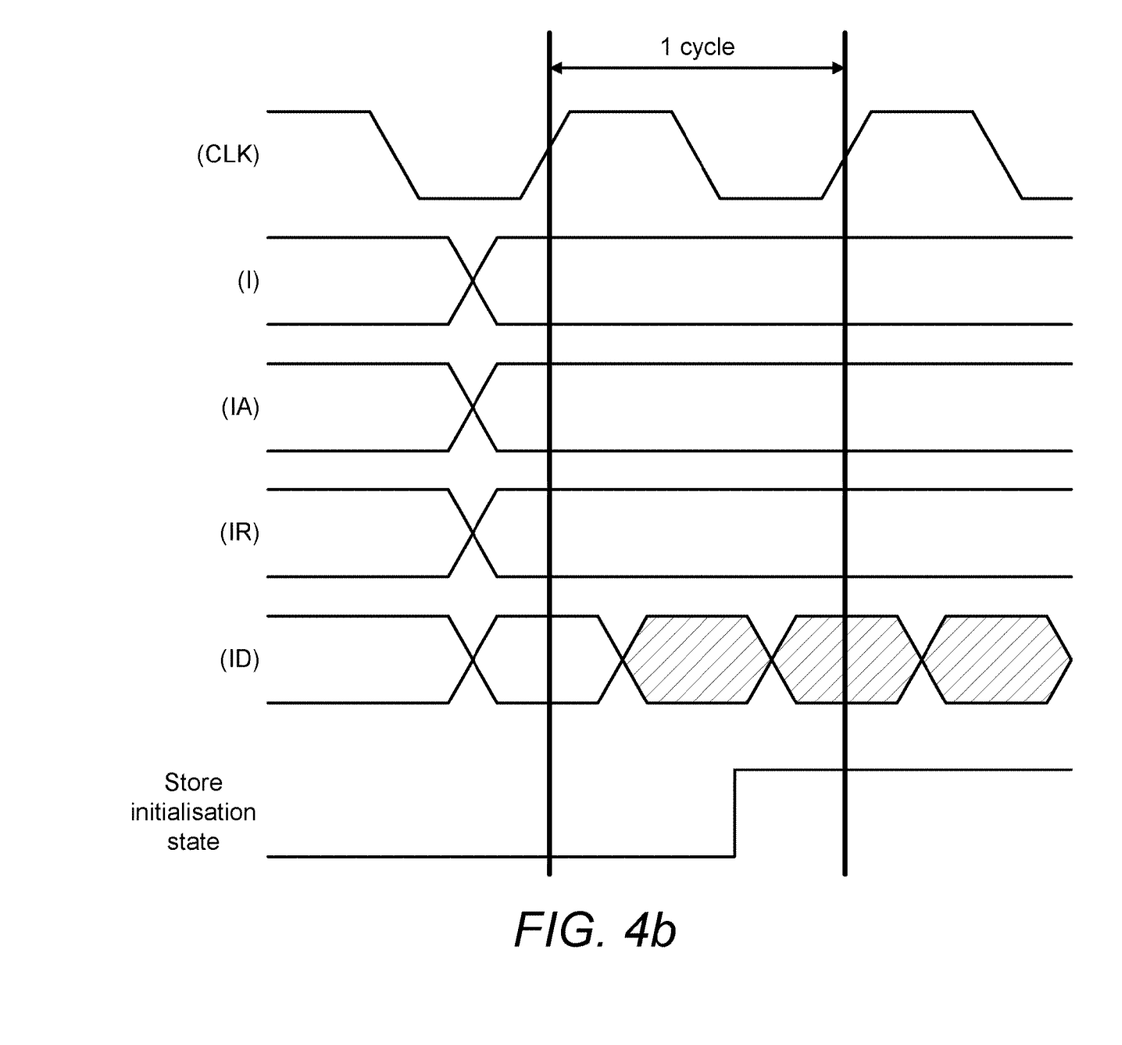

FIG. 4a schematically shows a block diagram of memory controller 8 and memory 10 according to an embodiment using the present techniques, whilst FIG. 4b schematically shows a timing diagram for initialising a portion of the memory 10 over a clock cycle.

In the present illustrative example, the memory 10 comprises a plurality of bitcells, which in the present illustrative example are arranged in a bank or array 205 comprising 'm' rows and 'l' columns, whereby, as above, each bitcell has a unique address defined by the intersection of a row and column, whereby the rows of bitcells are coupled to, and addressable via respective first signal lines, arranged as wordlines WL(0) to WL(m) in the present illustrative example, whilst the column of bitcells are coupled to and addressable via second signal lines arranged as bitlines BL(0) to BL(1).

In the context of the present disclosure, a signal line comprises a conductor for transmitting a signal, whereby a "wordline" transmits a signal to select the one or more bitcells in a read operation or a write operation (e.g. an initialization operation), whilst a "bitline" transmits a signal for controlling or driving one or more bitcells to alter a memory state thereof in a write operation, or to sense a memory state thereof in a read operation.

As above, the memory controller 8 is configured to generate hardware/electrical signals, such as address signals (A) and data signals (DQ) to initiate a read or write access to one or more target bitcells in the array 205, in response to access requests from a bus master (not shown).

The memory controller 8 is further configured to generate one or more initialisation signals comprising an initialise address (IA) signal, an initialise range (IR) signal, and an initialise data (ID) signal, which comprise hardware/electrical signals generated in response to instructions from a bus master.

In some embodiments, the memory controller 8 may generate an initialise (I) signal, indicative of a command for the memory 10 to perform an initialisation operation. For example, the initialise signal (I) may comprise encoded bit(s) which the memory 10 decodes and recognises as a command to initialise a portion of memory 10. However, in alternative embodiments, the memory 10 may recognise one or more of the initialise address (IA) signal, initialise range (IR) signal and initialise data (ID) signal as a command(s) to initialise a portion of memory 10. For example, the initialise (I) signal could be encoded in one of these signals, such as in the lowest bits in the initialise address (IA) signal.

In the present illustrative example, the initialise address (IA) signal, comprises a first or start address of the target portion, whereby the first address may refer to a bitcell, a word or a wordline.

The initialise range (IR) signal specifies the addresses up to a final or end address for the target portion, whereby the range may begin at the first address. In examples, the initialise range (IR) signal may be an offset value used to specify all addresses in the range from the first address to last address. In embodiments the addresses of the target portion are consecutive bitcell addresses.

It will be appreciated that the range may specify a portion of memory, such as a word, a part of a page, one or more pages or an array up to the whole memory.

In examples, the initialise address range (IR) signal may comprise one or more bits provided on a single input line to the memory 10. In other examples, the initialise address (IR) range signal may be provided on a bus line such as range bus 209.

The initialise data (ID) signal specifies a particular value, symbol, parameter or condition to be stored in the bitcells of the target portion to represent a memory state hereafter "initialisation state", of the bitcells thereof, whereby the control logic 203, 204 decoding the received initialise data (ID) signal will store the initialisation state to the bitcells of the target portion.

In embodiments, the initialise data (ID) signal may be provided on a single input line to the memory 10, or on a bus line such as the data bus 207. In further embodiments, the initialise data (ID) signal may be the data (DQ) signal and/or provided on data bus 107 (shown above in FIG. 3a). In further examples the initialise data (ID) signal may be optional, whereby a default initialisation state (e.g. all '1's or '0's) may be written to one or more of the bitcells during an initialisation operation when the memory 10 recognises a received signal as command to initialise a portion of memory 10. Such a received signal may include the initialise signal (I), the initialise address (IA) signal and initialise range (IR) signal.

In operation, the memory controller 8 receives access requests from a bus master to initialise a target portion of the memory 10.

In response to the access request, and as depicted in FIG. 4b, the memory controller 8 generates an initialise (I) signal, indicative of a command for the memory 10 to perform an initialisation operation. As above, the initialise (I) signal is optional. The memory controller also generates an initialise address (IA) signal specifying a first address of a target portion, and an initialise range (IR) signal, specifying all addresses of the target portion to be initialised.

The memory controller 8 further generates an initialise data (ID) signal, which specifies the initialisation state to be stored in the bitcells of the target portion. As above, the initialise data (ID) signal may be optional, whereby in alternative examples a default initialisation state (e.g. all '1's or '0's) may be written to one or more of the bitcells during an initialisation operation when the memory 10 recognises a received signal as command to initialise a portion of memory 10.

The control logic 203, 204 receives and decodes the initialise signal (I), the initialise address signal (IA) and the initialise range (IR) signal to identify the bitcells of the target portion, and decodes the initialise data signal (ID) to identify the initialisation state to be stored therein.

The control logic 203, 204 then generates initialise wordline signals (IWL) to select the respective bitcells and initialise bitline signals (IBL) and control or drive the selected bitcells to store the required initialisation state therein over the same clock cycle (e.g. on the rising edge of the clock signal (CLK)).

Therefore, in contrast to the arrangement of FIG. 3a, multiple bitcells on different wordlines can be initialised over the same clock cycle.

As discussed above, the time to initialise sufficient memory to start applications (e.g. following a boot, or a request by an application) is growing rapidly as memory capacity and application demand increases. Therefore, initialising a portion of memory in a single clock cycle means that a boot process or initialisation of a portion of memory for an application may be performed faster in comparison to the prior art arrangement of FIG. 3a, which is performed over many multiple clock cycles.

The memory 10 further comprises read logic 208 to determine the memory state of the bitcell(s), and generate an output (RQ) accordingly.

Whilst FIG. 4b depicts the initialisation signals (I), (IA), (IR) and (ID) as being generated over the same cycle, this is for illustrative purposes only, and these signals may be generated during different clock cycles. Furthermore, whilst FIG. 4b depicts the initialisation operation being performed in the clock cycle immediately following generation of the initialisation signals, the initialisation operation may be performed any number of clock cycles following generation of the initialisation signals. It will be appreciated that the clock signal may be generated by PLL (phase-locked loop), CDR (clock-data recovery), or any suitable generation means.

In embodiments, the memory 10 may generate an acknowledgement signal (ACK) to confirm that the initialisation operation was initiated and/or completed. Such an acknowledgment may be performed after the read logic verifies the initialisation state of the target bitcells.

Figure 4C:
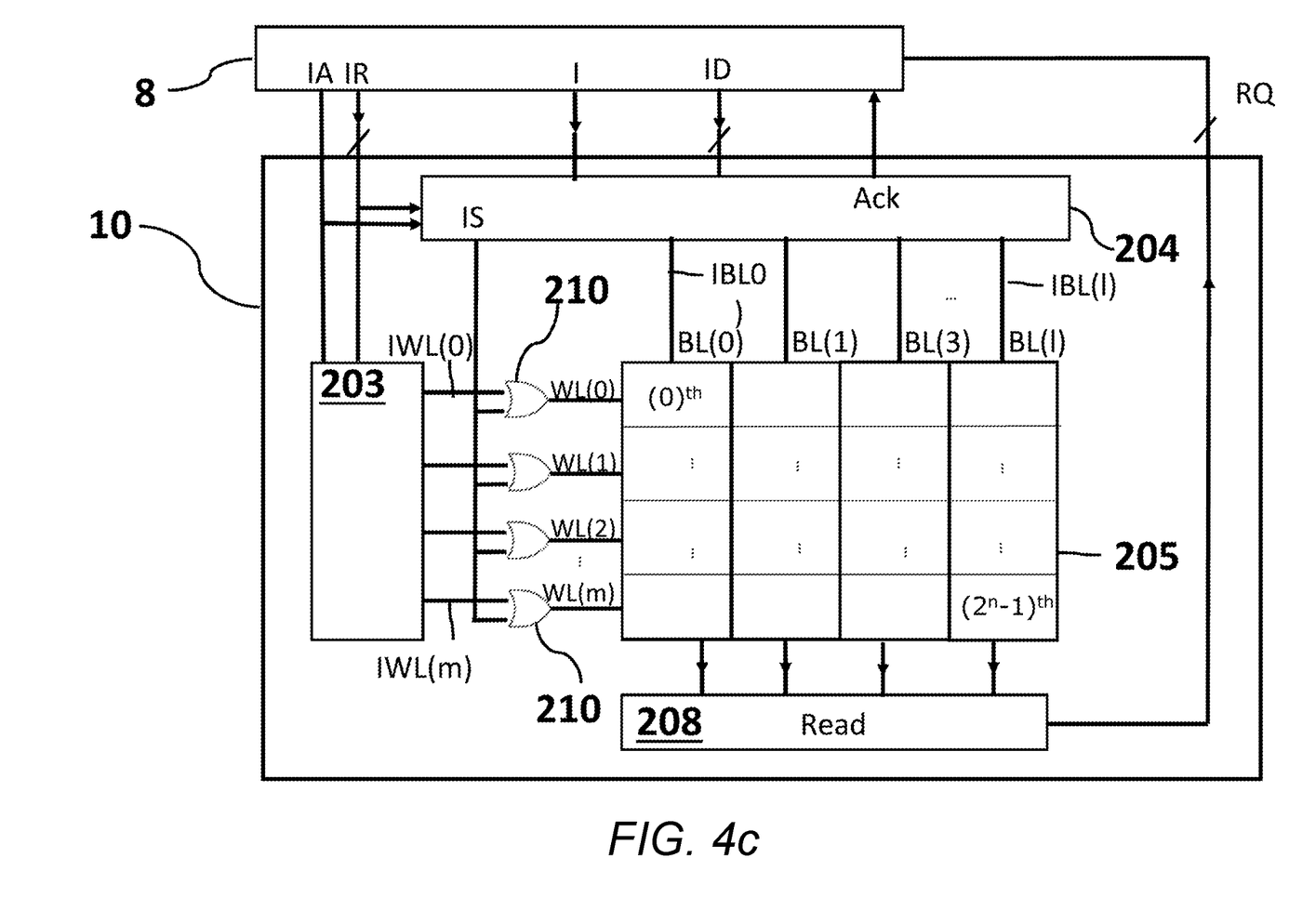
FIGS. 4c and 4d schematically show diagrams of a memory controller and a memory according to embodiments using the present techniques.

FIG. 4c schematically shows a block diagram of memory controller 8 and memory 10 according to a further embodiment.

The memory controller 8 and memory 10 are similar to those described above in FIG. 4a, whereby the control logic 203, 204 decodes initialisation signals (e.g. initialise (I) signal, the initialise address (IA) signal and the initialise range (IR) signal) to identify that an initialisation operation is required, and to identify the target portion to be initialised, and decodes the initialise data (ID) signal to identify the initialisation state to be stored in the target bitcells thereof.

In the present illustrative embodiment, the memory 10 comprises further logic, in the form of logic gates, the output of which is used to select a respective wordline, whereby, in the present illustrative example, the logic gates comprise 'OR' gates 210.

As described above in FIGS. 4a & 4b, the control logic 203, 204 can, by generating initialisation wordline signals (IWL) select the wordlines having the target bitcells coupled thereto, and by generating initialise bitline signals (IBL) control or drive the bitlines to write or store an initialisation state to the target bitcells coupled thereto, with the initialise wordline signals (IWL) used as first inputs to the respective logic gates in the present embodiment.

Furthermore, the control logic 204 depicted in FIG. 4c generates an initialise select (IS) signal, based, at least in part, on one or more of the initialisation signals (e.g. (I), (IA), (IR), (ID)), whereby the initialise select (IS) signal is used as a second input to the respective logic gates 210, to, when asserted, cause all logic gates 210 to select all the respective wordlines.

An initialisation state specified by the initialise data (ID) signal can then be written to all the target bitcells by controlling the bitlines, based, at least in part, on the decoded initialise data (ID) signal.

Therefore, the output of the logic gates 210 may be used to select one or more of the wordlines individually using the respective initialise wordline signals (IWL) generated based, at least in part, on the initialise address (IA) signal and/or the initialise range (IR) signal.

Alternatively, the logic gates 210 may be used to select all the wordlines in the array 205 substantially simultaneously in response to the (IS) signal, rather than requiring the control logic 203 to generate individual initialise wordline (IWL) signals.

Such functionality may decrease the time taken to initialise a plurality of target bitcells than would otherwise have taken.

Figure 4D:
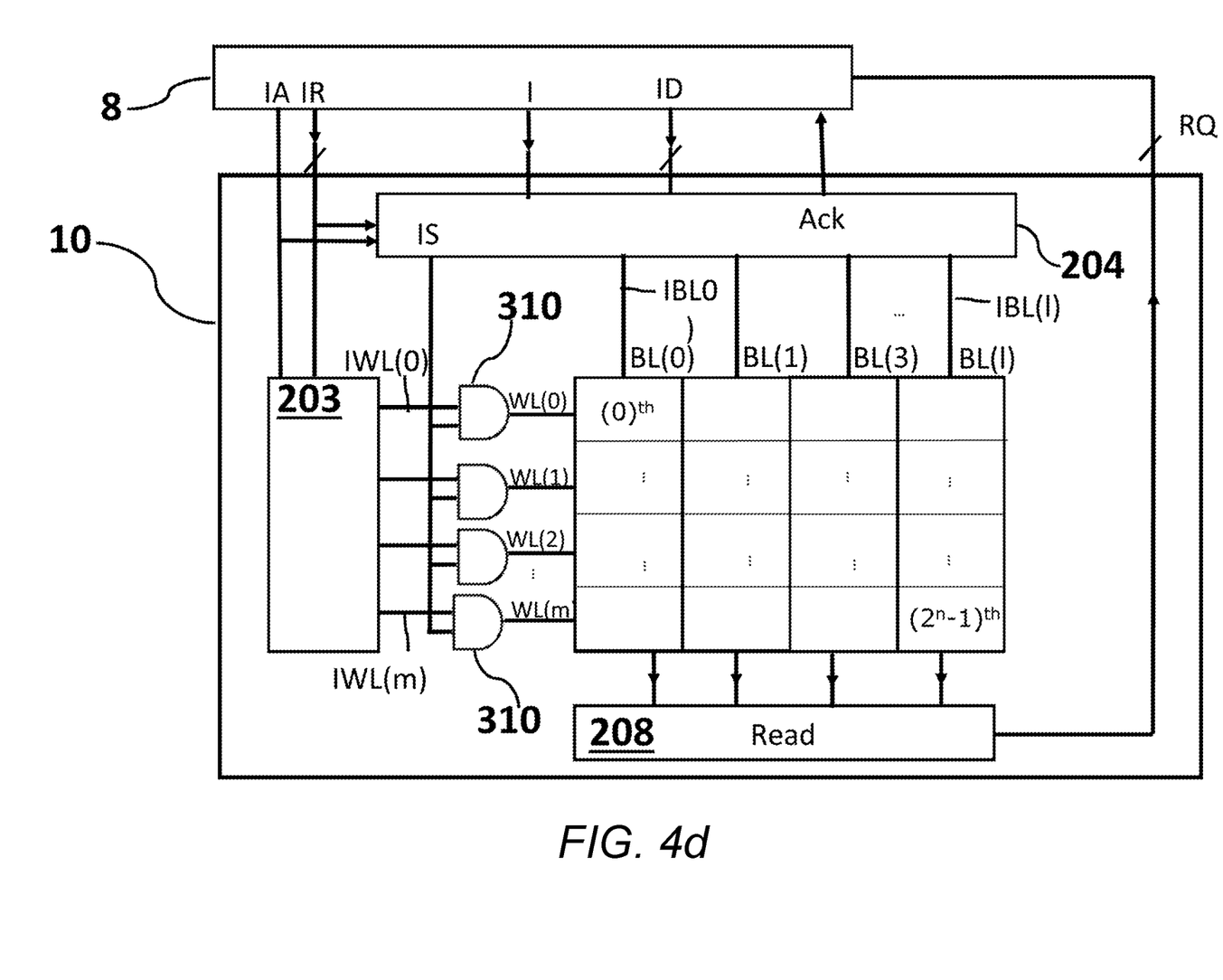

FIG. 4d schematically shows a block diagram of memory controller 8 and memory 10 according to a further embodiment. The memory controller 8 and memory 10 are similar to those described above in FIG. 4c.

The logic gates of FIG. 4d comprise 'AND' gates 310, with the initialise wordline signals (IWL) used as a first input to the respective AND gates 310 on the respective wordlines.

In the present embodiment, the control logic 204 also generates an initialise select signal (IS), based, at least in part, on one or more of the initialisation signals (e.g. (I), (IA), (IR), (ID)), whereby (IS) is provided as a second input to the AND gates 310, such that a target wordline will only be selected when the initialise select (IS) signal is asserted and one or more initialise wordline signals (IWL) are asserted by the control logic 203, 204.

Therefore, in the present embodiment, the (IS) signal may be used as a control signal, whereby the initialisation state of a particular bitcell(s) will only be stored or written when (IS) and the corresponding initialisation wordline signal (IWL) are asserted.

Such functionality may prevent writing erroneous initialisation states to non-target bitcells.

Whilst the logic gates 210, 310 in FIGS. 4c & 4d are depicted as OR and AND gates respectively, the claims are not limited in this respect, and the logic gates may comprise one or more logic gates arranged to provide any logic operation (e.g. NOR, NAND, NOR etc.).

As described above, the memory 10 may be a volatile memory or non-volatile (NV) memory, whereby the NV memory may comprise a storage class memory (SCM).

Figure 5:
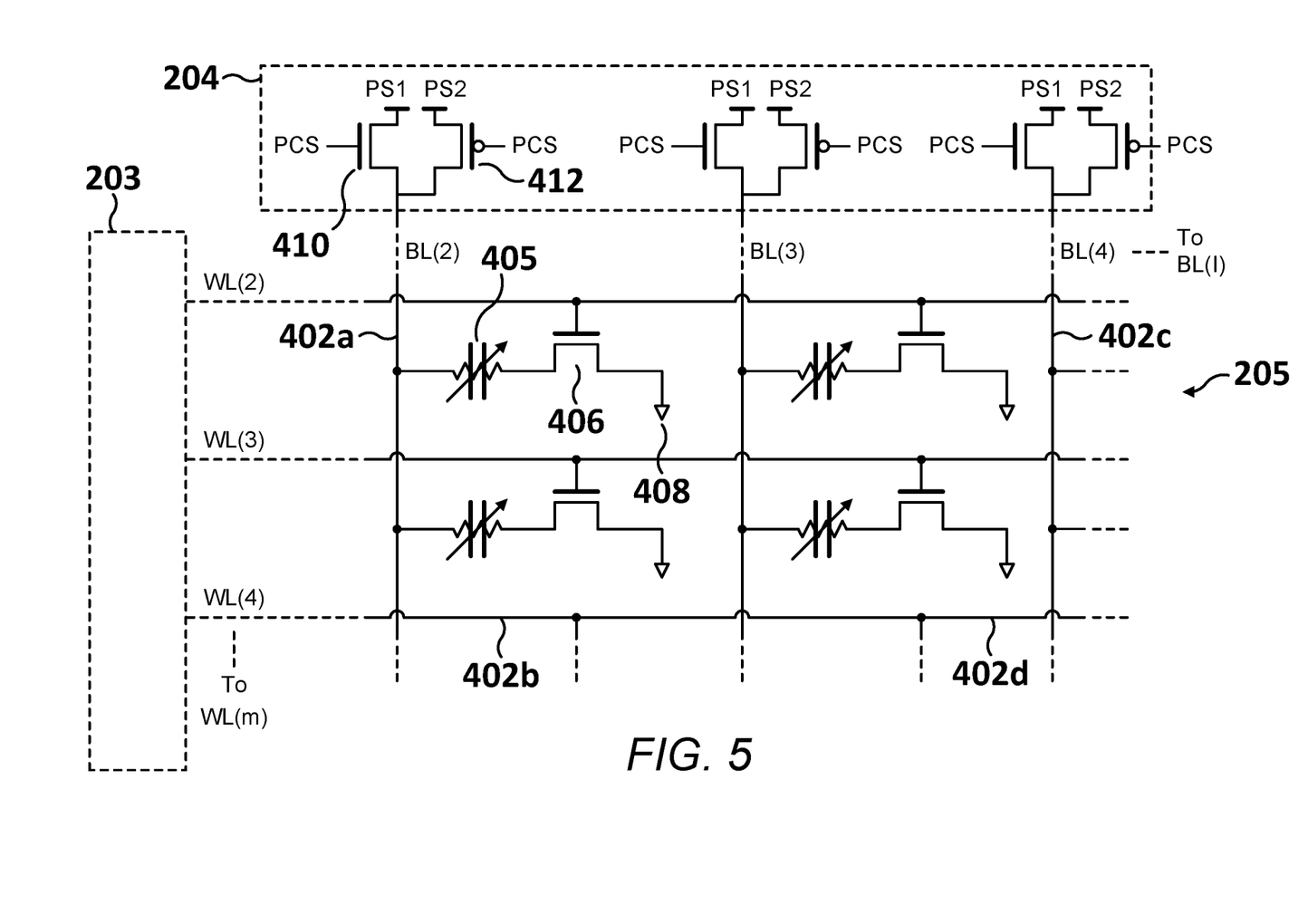
FIG. 5 schematically shows an architecture for a memory array according to an embodiment using the present techniques.

FIG. 5 is a schematic diagram of example architecture for memory array 205 of FIGS. 4a to 4d above.

As above, the memory array 205 comprises a plurality of bitcells 402 (four of which 402a-d are depicted in FIG. 5), arranged in rows (m) and columns (l) and which may be addressed by control logic 203, 204 as previously described.

In the present illustrative example, each bitcell 402a-d comprises a storage element 405 coupled between a respective bitline and a first terminal of a conducting element 406, whilst a second terminal of conducting element 406 is coupled to a reference node 408.

In the present illustrative example, a third terminal (e.g. gate terminal) of the conducting element 406 is coupled to a respective wordline, whereby an operating state of the conducting element may be controlled via the respective wordline.

In the context of the present disclosure, a "conducting element" comprises a circuit element capable of controlling the flow of current between the first and second terminals thereof, depending on the operating state thereof which, as above, maybe controlled via its third terminal. For example, when in an "on" or "closed" state the conducting element 406 permits current to pass between its first and second terminals, whilst in an "off" or "open" state the conducting element 406 prevents substantially all current from passing between its first and second terminals.

Furthermore, a "reference node" comprises a node in a circuit that is maintained at a particular voltage level or at a particular voltage difference from another node in the circuit. In one example, the reference node 408 may comprise or be connected to a ground node. In other particular implementations, the reference node 408 may be maintained at a particular voltage relative to that of a ground node.

In the illustrative example depicted in FIG. 5, the storage element 405 comprises a correlated electron switch (CES) having a correlated electron material (CEM) sandwiched between conductive terminals.

The CES may be placed in a first impedance state comprising a low impedance or conductive state, by application of a first programming signal (PS1) comprising a first voltage ($V_{SET}$) at a first current density ($J_{SET}$)($J(A/\mu m^2)$)) across its conductive terminals, whereby the first impedance state represents a first memory state of the bitcell.

The CES may also be placed in a second impedance state comprising a high impedance or insulative state, by application of a second programming signal (PS2) comprising a second voltage ($V_{RESET}$) at current density ($J_{RESET}$) across its conductive terminals, whereby the second impedance state represents a second memory state of the bitcell. In embodiments, $|V_{SET}|>|V_{RESET}|$ and $|J_{RESET}|>|J_{SET}|$.

In context of the present disclosure, an "impedance state" means a detectable impedance state of the CES that represents a memory state of the associated bitcell.

Furthermore, it should be understood that the terms "low impedance state" and "high impedance state" are relative terms and not specific to any particular value for impedance, conductance or capacitance. For example, whilst in a low impedance state the CES may be more conductive (or less insulative), than while the CES is in a high impedance state.

The programming signal (PS1 or PS2) to place a CES in a particular impendence state may be generated or supplied by control logic 204 via the respective bitlines. Furthermore, both the voltage (V) and current density (J) of the programming signal may be controlled (e.g. by the control logic) to switch the impedance state of the CES. For example, when the CES is in a first impedance state, and voltage ($V_{RESET}$) is applied, the CES will not switch to the second impedance state until the current density is at the required value of ($J_{RESET}$).

In the present illustrative example, the programming signal (PS1) or (PS2) is applied to the respective bitlines via conducting elements 410, 412 when the corresponding wordlines are selected by control logic 203, whereby, in the present illustrative example, the operating state of conducting elements 410, 412 is controlled using programming control signal (PCS), which may be generated at the control logic 404 based, at least in part, on an initialisation data (ID) signal from memory controller 404, or the programming control signal (PCS) may be based on a page to be written to one or more of the bitcells.

The conducting elements 410, 412 may be transistors such as a field effect transistors (FET). In the illustrative example of FIG. 5, conducting element 410 is an nFET, whilst conducting element 412 is a pFET, such that when PCS is high (e.g. logic 1), conducting element 410 is in a closed or "on" state and conducting element 412 is in an open or "off" state, such that first programming signal (PS1) is applied to a target CES.

Similarly, when PCS is low (e.g. logic 0), conducting element 412 is in a closed or "on" state and conducting element 410 is in an open or "off" state such that the second programming signal (PS2) is applied to a bitline of a target CES.

It will be understood therefore that the impedance state of one or more of the CESs may be controlled by applying the first or second programming signals (PS1 or PS2) thereto based, at least in part, on an initialisation data (ID) signal from memory controller.

In typical operation, the write current when writing to a bitcell comprising a CES storage element using the first programming signal (PS1) or second programming signal (PS2) is reduced in comparison to writing to a bitcell of other types of memory such as STT-MRAM.

Therefore, it will be appreciated that it is possible to write to or initialise large numbers of CES storage elements during a single cycle with reduced write current in comparison to other storage types.

It will be understood that conducting elements 406, 410, 412 described above are not limited to being FETs and may be any suitable type of transistor such as a bipolar junction transistor (BJT). It will also be understood that the conducting elements 406, 410, 412 are also not limited to being transistors, and other types of devices such as diodes, variable resistor, etc. may be used as a conducting element, and that the claimed subject matter is not limited in this respect.

It will also be understood that the present architectures are provided as illustrative examples only, and any suitable architecture for the memory array may be used. For example, the array 205 is not limited to having CES storage elements in the arrangement depicted in FIG. 5, but the techniques may be used with different storage elements arranged to store a value, symbol, parameter or condition as a memory state of the associated bitcell. As an illustrative example, a storage element 405 may comprise one or more resistors (e.g. a variable resistors), one or more capacitors and/or one or more transistors arranged to store a value, symbol, parameter or condition as a memory state of the associated bitcell.

Figure 6:
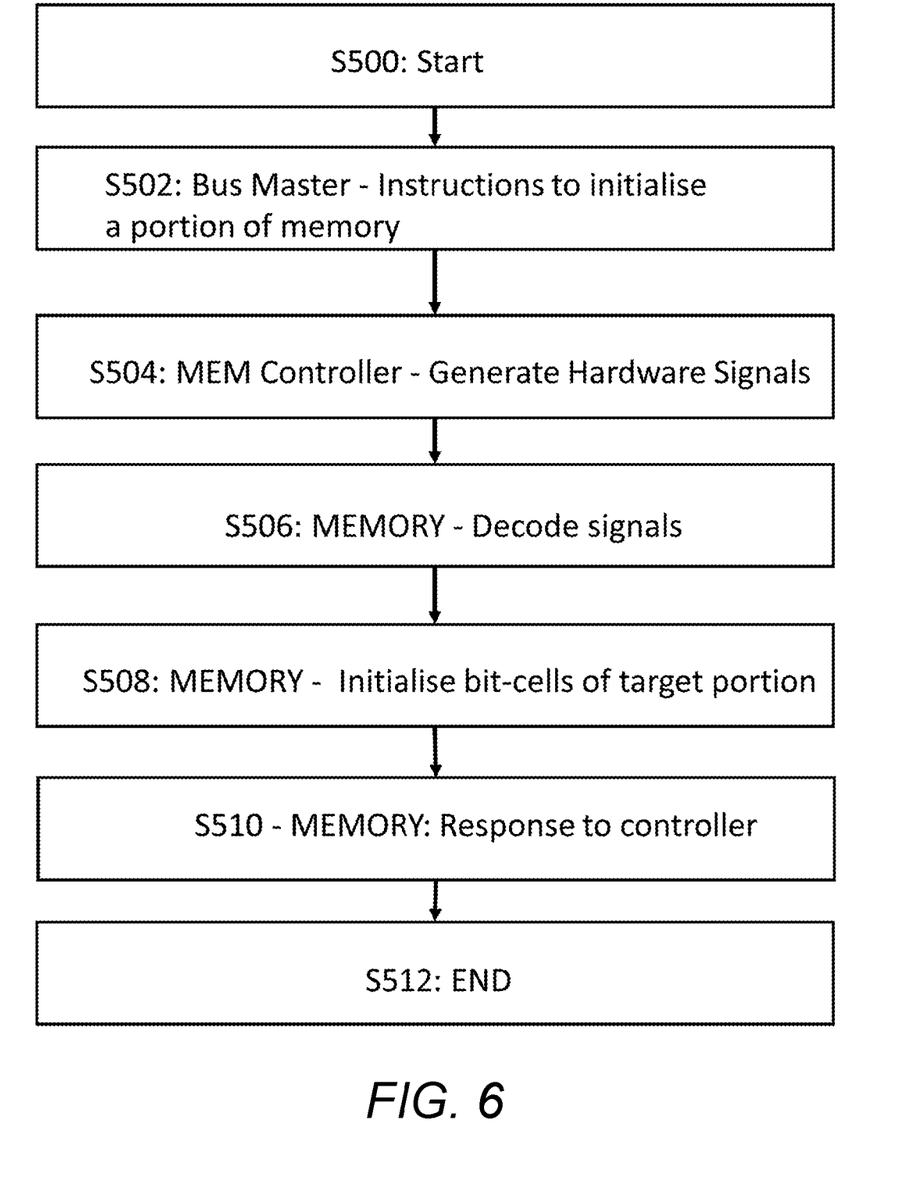
FIG. 6 shows an example flow diagram showing the process of initialising a portion of memory according to an embodiment using the present techniques.

FIG. 6 shows an example flow diagram showing the process of initialising a portion of memory.

At Step S500 the process starts.

At Step S502, a bus master, such as a processor, generates software instructions specifying an access request to initialise a portion of memory (e.g. word, page, whole array, whole of memory etc.), and transmits the instructions to a memory controller. As above, in the context of the present disclosure, initialisation of a portion of memory generally refers to the process of writing the same value, symbol, parameter or condition to all the bitcells of the target portion such that all bitcells represent the same initialisation state.

At step S504, the memory controller translates the software instructions into hardware/electrical signals and transmits the signals to memory.

In the present embodiment, the hardware signals comprise an initialise (I) signal, an initialise address (IA) signal comprising an address of the portion to be initialised, an initialise range (IR) signal specifying the range of addresses in the portion of memory to be initialised, and an initialise data (ID) signal specifying the initialisation state to be written to the specified bitcells.

At step S506, control logic in the memory decodes the hardware signals from the memory controller, and at step S508 selects the appropriate wordlines, and writes an initialisation state to the bitcells of the target portion based, at least in part, on the initialise data (ID) signal.

The bitcells comprise storage element(s) for storing a value, symbol, parameter or condition as a memory state of the associated bitcell. In embodiments the storage element(s) comprise CES(s), whereby initialising a CES means applying a programming signal to place the CES in a high- or low-impedance state based, at least in part on, the initialise data (ID) signal. Using CES as storage elements in the array reduces the write current in comparison to other types of storage elements such as STT-MRAM, NAND or NOR Flash, etc.

At step S510, the control logic optionally generates an acknowledgement signal (ACK) to confirm that the initialisation operation was initiated and/or completed.

At step S512 the process ends.

In the preceding description, various details are described to provide an understanding of various embodiments. However, it will be appreciated that various embodiments may be practiced without the specific details.

In other instances, well-known methods, procedures, components, and logic have not been described in detail so as not to obscure the particular embodiments. Furthermore, various aspects of embodiments may be performed using various means, such as hardware (e.g. circuits, such integrated semiconductor circuits), software (e.g. computer program code), or some combination of hardware and software.

For the purposes of this disclosure reference to "logic" shall mean either hardware, software, or some combination thereof.

As mentioned above, and as depicted in FIG. 5, the storage elements of the bitcells of array 205 may comprise a CES. In this context, a CES may exhibit an abrupt conductor/insulator transition from a low impedance (and low capacitance) state to a high impedance (and high capacitance) state, or vice versa, arising from electron correlations in the CEM rather than solid state structural phase changes (e.g., crystalline/amorphous changes as occurs in phase change memory (PCM) devices or filamentary formation as occurs in resistive RAM devices).

In embodiments, the abrupt conductor/insulator transition in a CEM may be responsive to a quantum mechanical phenomenon, in contrast to melting/solidification or filament formation. Such a quantum mechanical transition between impedance states in a CES may be understood in any one of several aspects.

In embodiments, the quantum mechanical transitions between first and second impedance states may be understood in terms of Mott transitions. For example, a CEM may switch from a high impedance state to a low impedance state when a first Mott transition condition is met and may switch from a low impedance state to a high impedance state when a second Mott transition condition is met. The different Mott transition conditions will be described in further detail below.

In one aspect, the impedance of the CES in the second impedance state may be more than 100 times greater than the impedance of the CES in the first impedance state.

In an embodiment, the CEM comprises a switching region (S) arranged in electrical contact with (e.g. sandwiched between) conductive regions (C), in a (C/S/C) arrangement on a semiconductor (e.g. in a stack arrangement). The conductive region (C) may comprise any suitable material, and may comprise a transition metal oxide, and may further include any material comprising metal-like characteristics, including, for example, polysilicon or a doped semiconductor.

In embodiments, the conductive region (C) may additionally or alternatively comprise a material selected from a group comprising aluminium, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

According to an embodiment, the switching region (S) may comprise any transition metal oxide (TMO) material, such as, for example, perovskites, Mott insulators, charge exchange insulators, and Anderson disorder insulators.

In particular implementations, the switching region (S) material may include switching materials such as nickel oxide, cobalt oxide, iron oxide, yttrium oxide, and perovskites such as Cr doped strontium titanate, lanthanum titanate, and the manganate family including praesydium calcium, manganate, and praesydium lanthanum manganite, just to provide a few examples. In particular, oxides incorporating elements with incomplete d and f orbital shells may exhibit sufficient resistive switching properties for use as a switching region (S) material. In an embodiment, the CES may be prepared without electroforming.

Other implementations may employ other transition metal compounds as the switching region (S) material without deviating from claimed subject matter. For example, $\{M(chxn)_2Br\}Br_2$ where M may comprise Pt, Pd, or Ni, and chxn comprises 1R, 2R-cyclohexanediamine, and other such metal complexes may be used without deviating from claimed subject matter.

In one aspect, the CEM may comprise materials that are TMO variable resistance materials, though it should be understood that these are exemplary only, and are not intended to limit claimed subject matter.

Particular implementations may employ other variable resistance materials as well. Whilst nickel oxide, NiO, is disclosed as one particular TMO above, NiO materials may also be doped with extrinsic ligands, which may stabilize variable resistance properties. In particular, NiO variable resistance materials disclosed herein may include a carbon containing ligand, which may be indicated by NiO(Cx). Here, one skilled in the art may determine a value of x for any specific carbon containing ligand and any specific combination of carbon containing ligand with NiO simply by balancing valences. In another particular example, NiO doped with extrinsic ligands may be expressed as NiO(Lx), where Lx is a ligand element or compound and x indicates a number of units of the ligand for one unit of NiO. One skilled in the art may determine a value of x for any specific ligand and any specific combination of ligand with NiO or any other transition metal simply by balancing valences.

Furthermore, the terminals may comprise the same materials as the conductive regions (C), such that the conductive regions (C) may function as the terminals. In embodiments where the material for the terminals and the conductive regions (C) are not the same, it is preferable that the different materials are matched to reduce the effects of border interactions or surface defects which may otherwise affect performance of the CES. For example, the materials should be matched to ensure the electrical properties (e.g. conductivities) and/or chemical properties (e.g. coefficients of thermal expansion match) of the CEM and terminals do not negatively impact the operation of the CES.

Whilst the embodiments above depict the memory array comprising rows and columns, the claims are not limited in this respect, and the bitcells may arranged in any appropriate configuration be selected and driven via signal lines as appropriate.

Computer program code for carrying out operations of the present techniques may be written in any combination of one or more programming languages, including object oriented programming languages and conventional procedural programming languages.

For example, program code for carrying out operations of the present techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

It will be clear to one skilled in the art that many improvements and modifications can be made to the foregoing exemplary embodiments without departing from the scope of the present techniques.

The invention claimed is:

1. A system comprising:
a storage device having a storage portion comprising a plurality of bitcells coupled to respective first signal lines and second signal lines and control logic to alter a memory state of the plurality of bitcells via the first signal lines and the second signal lines;
a memory controller coupled to the storage device to transmit one or more encoded initialisation signals to the storage device;
wherein the storage device is configured to decode the one or more encoded initialisation signals and initialise the storage portion over a clock cycle in response to the one or more decoded initialisation signals.

2. The system of claim 1, wherein the one or more initialisation signals comprise one or more of: an initialise signal, an initialise address signal, an initialise range signal and an initialise data signal.

3. The system of claim 2, wherein the initialise address signal specifies a start address of the storage portion.

4. The system of claim 2, wherein the initialise range signal specifies addresses of a plurality of storage portions.

5. The system of claim 2, wherein the initialise range signal comprises an offset value.

6. The system of claim 2, wherein the initialise data signal specifies an initialisation state for the plurality of bitcells.

7. The system of claim 2, wherein the control logic selects the first signal lines based, at least in part, on one or more of: the initialise address signal and the initialise range signal.

8. The system of claim 1, wherein the plurality of bitcells are coupled to two or more second signal lines.

9. The system of claim 2, wherein the storage device generates an initialise select signal based, at least in part, on one or more of: the initialise signal, the initialise address signal, the initialise range signal and the initialise data signal.

10. The system of claim 9, wherein the storage device comprises logic to select the first signal lines based, at least in part, on one or more of: the initialise select signal and an initialise wordline signal.

11. The system of claim 10, wherein the logic comprises an OR gate or an AND gate.

12. The system of claim 1, wherein each bitcell of the plurality of bitcells comprises a storage element to represent a memory state of the bitcell.

13. The system of claim 12, wherein each storage element comprises a correlated electron switch.

14. The system of claim 13, wherein the control logic is to apply a first programming signal to place the correlated electron switches in a first impedance state.

15. The system of claim 14 wherein the first impedance state comprises a low impendence state.

16. The system of claim 14, wherein the control logic is to apply a second programming signal to place the correlated electron switches in a second impedance state.

17. The system of claim 16, wherein the second impedance state comprises a high impendence state.

18. The system of claim 16, wherein the first or the second programming signal is based, at least in part, on one of an initialise data signal and a default initialisation state.

19. A method of initialising a portion of storage on a storage device, the method comprising:
generating, at a memory controller, encoded initialisation signals based, at least in part, on instructions from a bus master to initialise the portion of storage, the portion of storage comprising a plurality of bitcells coupled to respective first signal lines and second signal lines;
decoding, at the storage device, the encoded initialisation signals; and
initialising, at the storage device, the portion of storage over a clock cycle in response to the decoded initialisation signals.

20. A storage device, having an addressable portion comprising a plurality of bitcells coupled to respective first signal lines and second signal lines, and control logic to alter a memory state of the bitcells; wherein the storage device is configured to:
decode one or more initialisation signals from a memory controller; and
initialise the plurality of bitcells over a clock cycle in response to the decoded one or more initialisation signals.

* * * * *